(12) United States Patent
Magno et al.

(10) Patent No.: US 12,193,329 B2
(45) Date of Patent: Jan. 7, 2025

(54) LIGHT EMITTING ELECTROCHEMICAL CELLS WITH BAND-EDGE ENHANCED LIGHT EMISSION DUE TO CHIRAL LIQUID CRYSTALLINE STRUCTURE

(71) Applicant: RED BANK TECHNOLOGIES LLC, Red Bank, NJ (US)

(72) Inventors: John Magno, St. James, NY (US); Gene C. Koch, Toms River, NJ (US)

(73) Assignee: Red Bank Technologies LLC, Red Bank, NJ (US)

( * ) Notice: Subject to any disclaimer, the term of this patent is extended or adjusted under 35 U.S.C. 154(b) by 767 days.

(21) Appl. No.: 17/254,637

(22) PCT Filed: Jun. 28, 2019

(86) PCT No.: PCT/US2019/039710
§ 371 (c)(1),
(2) Date: Dec. 21, 2020

(87) PCT Pub. No.: WO2020/006344
PCT Pub. Date: Jan. 2, 2020

(65) Prior Publication Data
US 2021/0119151 A1    Apr. 22, 2021

Related U.S. Application Data

(60) Provisional application No. 62/691,865, filed on Jun. 29, 2018.

(51) Int. Cl.
*H01L 51/00* (2006.01)
*C09K 11/06* (2006.01)
(Continued)

(52) U.S. Cl.
CPC ......... *H10K 85/731* (2023.02); *H10K 85/344* (2023.02); *C09K 2211/1029* (2013.01); *C09K 2211/185* (2013.01); *H10K 50/135* (2023.02)

(58) Field of Classification Search
None
See application file for complete search history.

(56) References Cited

U.S. PATENT DOCUMENTS 5,682,043 A   10/1997  Pei et al.
6,867,243 B2   3/2005  O'Neill et al.
(Continued)

FOREIGN PATENT DOCUMENTS

JP    S6184627 A    4/1986
JP    2000195673    7/2000
(Continued)

OTHER PUBLICATIONS

Gao et al.; "Solid State Organic Ligt emitting diodes based on tris(2,2'-bipyridine)ruthenium(II) complexes", J. Am. Chem. Soc vol. 122; pp. 7426-7427 Feb. 24, 2000.
(Continued)

*Primary Examiner* — Eli D. Strah

(74) *Attorney, Agent, or Firm* — Kolisch Hartwell, P.C.

(57) ABSTRACT

Light emitting electrochemical cell devices comprising chiral liquid crystalline materials. The chiral liquid crystalline material mixtures of the devices function as both electrolytes and as light emitting materials. The chiral liquid crystalline
(Continued)

material mixtures also form photonic crystal structures creating a photonic stop band. The presence of the photonic stop band enables the light emitting electrochemical cell devices to emit light with improved energy efficiency.

18 Claims, 4 Drawing Sheets

(51) Int. Cl.
*H10K 85/00* (2023.01)
*H10K 85/30* (2023.01)
*H10K 50/135* (2023.01)

(56) References Cited

U.S. PATENT DOCUMENTS

| | | | |
|---|---|---|---|
| 9,508,942 B2 | 11/2016 | Koch | |
| 2002/0160296 A1* | 10/2002 | Wolk | H10K 71/18 |
| | | | 156/235 |
| 2006/0262248 A1* | 11/2006 | Burberry | G02F 1/133707 |
| | | | 349/86 |
| 2007/0002422 A1 | 1/2007 | O'Shaughnessy | |
| 2015/0318498 A1 | 11/2015 | Stoessel et al. | |
| 2017/0033290 A1* | 2/2017 | Judd | H10K 85/113 |
| 2018/0183007 A1 | 6/2018 | Magno et al. | |

FOREIGN PATENT DOCUMENTS

| | | |
|---|---|---|
| JP | 2009221124 | 10/2001 |
| JP | 2004525493 A | 8/2004 |
| JP | 2005528759 A | 9/2005 |
| JP | 2017513946 A | 6/2017 |
| KR | 20050016489 A | 2/2005 |
| WO | WO 03/103067 A2 | 11/2003 |
| WO | WO-2016209797 A1 * | 12/2016 ............ C30B 23/00 |
| WO | 2017156433 A1 | 9/2017 |
| WO | 2018065786 A1 | 4/2018 |

OTHER PUBLICATIONS

International Search Report and Written Opinion for corresponding international patent application PCT/US19/39710 dated Oct. 18, 2019.

International Preliminary Report on Patentability for corresponding international patent application PCT/US19/39710 dated Dec. 29, 2020.

European Search Report and Written Opinion for corresponding European Patent Application 198254569.0 dated Feb. 16, 2022.

Lee et al.; synthesis and Characterization of an Electroluminescent Polyester Containing the Ru(II) Complex; Chem. Mater. 1997, 9, 1710-1712.

Intellectual Property India, "Examination Report" in connection with related Indian Patent Application No. 202127003677, dated Oct. 4, 2022, 6 pages.

Parashkov, Radoslav, Primary Examiner, European Patent Office, "Communication pursuant to Article 94(3) EPC" in connection with related European Patent Application No. 19825469.0, dated Jun. 4, 2024, 4 pages.

Pei, Qibing et al., Abstract of "Polymer Light-Emitting Electrochemical Cells", Science, vol. 269, Issue 5227, Aug. 25, 1995, pp. 1086-1088.

Sin, Jae-Kyoung, Examiner, Korean Intellectual Property Office, "Notice of Preliminary Rejection" in connection with related Korean Patent Application No. 10-2021-7003160, dated Oct. 18, 2023, 6 pages.

Watanabe, Yoshiki, Patent Examiner, Japan Patent Office, "Decision of Refusal" in connection with related Japanese Patent Application No. 2020-573336, dated Oct. 5, 2023, 8 pages.

* cited by examiner

LIGHT EMITTING ELECTROCHEMICAL CELLS WITH BAND-EDGE ENHANCED LIGHT EMISSION DUE TO CHIRAL LIQUID CRYSTALLINE STRUCTURE

CROSS-REFERENCE TO RELATED APPLICATION

This application is a 371 National Stage of International Application No. PCT/US19/39710, filed Jun. 28, 2019, which was published as International Publication No. WO 2020/006344, and which claims the benefit under 35 U.S.C. § 119(e) of the earlier filing date of U.S. Provisional Patent Application No. 62/691,865 filed on Jun. 29, 2018 the disclosure of which is incorporated by reference herein.

BACKGROUND

Light Emitting Electrochemical Cells (LECs) are light emitting devices based on the electroluminescence of organic or organometallic materials. Both LECs and organic light emitting diodes (OLEDs) consist of one or more layers of organic material sandwiched between two electrodes. The difference between the two is that while in OLEDs the electron and hole charge carriers are generated external to the device and injected into the organic material through a cathodes or anodes, in LECs the ionic charge carriers are generated at an electrode by reaction with electrons or loss of electrons at which time these ionic charge carriers traverse the device. The first LECs produced had an organic layer consisting of a polymeric light emitting material (generally much like those used in OLEDs) and a solid electrolyte (Q. B. Pei, et al., Science 269, 1086-1088 (1995)).

DESCRIPTION OF THE INVENTION

Embodiments in accordance with this disclosure include an organic layer with a chiral nematic liquid crystalline structure and the mixture of large amounts of the electrolytes used into a liquid crystalline polymer matrix would seem to defeat this purpose. Since in LECs there is only a single layer of an organic material or a single layer of a mixture of organic materials between the electrodes, the use of the IMTC (ionic transition metal complexes) alone introduced the idea of an organic light emitting device comprising a single organic material, a great simplification over OLEDs. The IMTC-based devices also had the potential of greater energy efficiency over the earlier polymer-based LECs because the IMTCs were triplet light emitters (phosphorescent materials) as opposed to the singlet emitting polymers. Even with the use of IMTCs, the LECs that have been produced to this time have been limited in both their light output and the energy efficiency of its production. This is in considerable part due to the excitons produced by the interaction of ions in the center of the organic layer having sufficient mobility to encounter polarons or other species and then be quenched.

Figure 2:
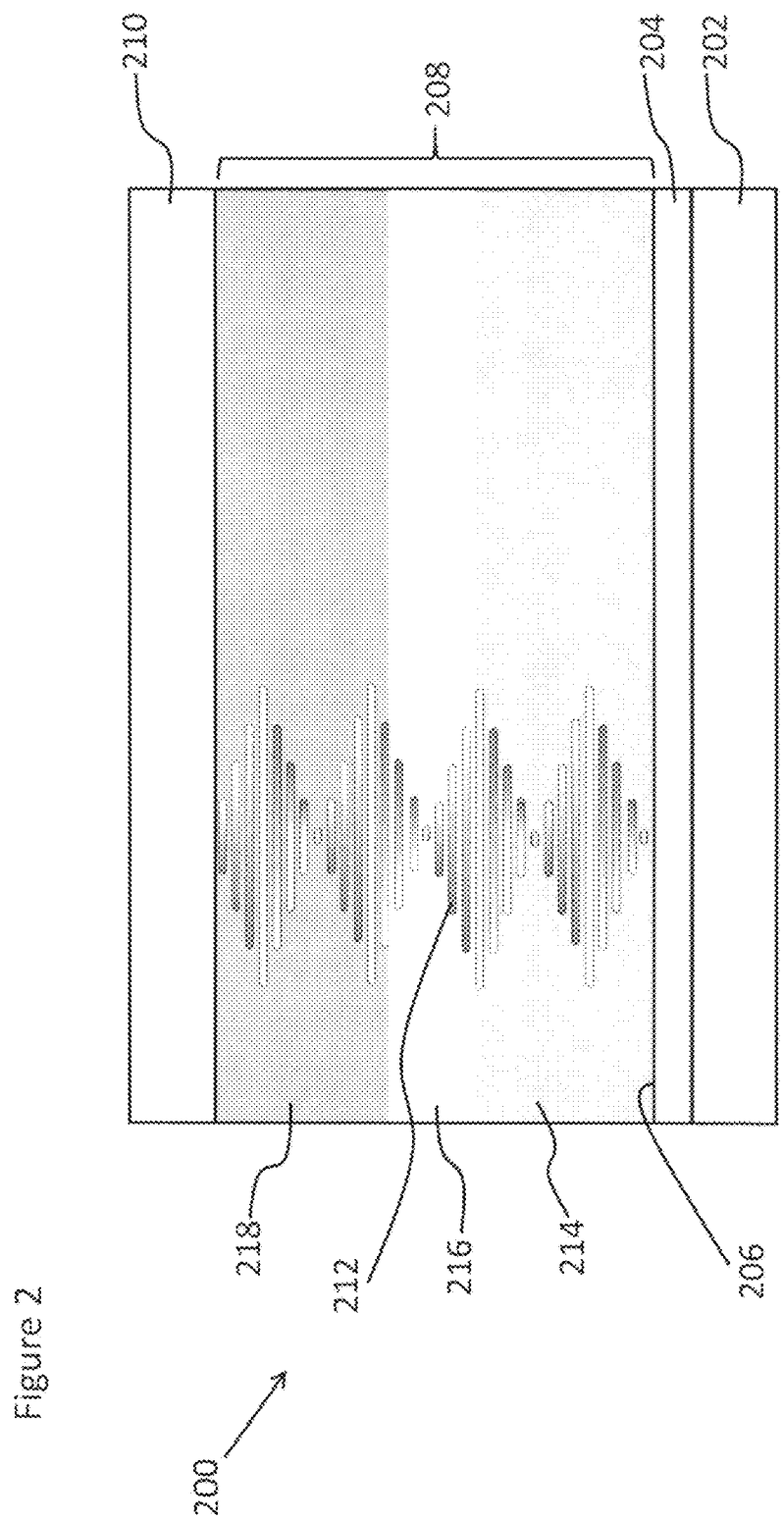
FIG. 2 illustrates a light emitting electrochemical cell of the invention.

The structure of light emitting electrochemical cell (LEC) 200 is depicted in FIG. 2. An LEC comprises a first electrode 202 that may be formed either from a light transmissive material or a light reflective material. If the first electrode 202 is light transmissive, it may be formed from indium-tin oxide, tin oxide, graphene or some other suitable light transmissive material. If the first electrode 202 is light reflective, it may be formed from aluminum, a magnesium/aluminum alloy or some other suitable light reflective material.

The inventive LEC 200 further comprises a conductive liquid crystal alignment layer 204 that is formed on the surface of the first electrode 202. This layer 204 conducts electric charge carriers from first electrode through to the chiral liquid crystalline organic material layer 208. This layer 204 further has the property that when a layer of liquid crystalline fluid material is formed on its upper surface 206, the rod-shaped molecules of the liquid crystal fluid material adjacent to the surface of layer 204 will be uniformly aligned with their long axes all oriented in the same direction (as much as random thermal oscillation in the liquid crystalline phase will allow) and also with their long axes parallel to the surface 206 of liquid crystal alignment layer 204. The conductive liquid crystal alignment layer 204 may be a rubbed layer of poly(3,4-ethylenedioxythiophene) polystyrene sulfonate (PEDOT:PSS), a conductive liquid crystal photoalignment layer like those described in U.S. Pat. No. 9,508,942, or other electrically conductive liquid crystal alignment layers as are known in the art.

The inventive LEC 200 further comprises a chiral liquid crystalline organic material layer 208. This layer has chiral liquid crystalline structure in which rod-shaped molecules within the layer are oriented with their long axes parallel to the surface 206 and with the direction of their long axes twisting in a helical fashion as one passes upwards through layer 208. This arrangement is depicted schematically (but on a much enlarged scale) by the arrangement of rod-shaped objects 212. It is preferred that this arrangement results from the material of layer 208 having chiral nematic (also termed cholesteric) liquid crystalline order. The material of layer 208 may be a liquid crystalline fluid, but it is preferred that the material be a solid. If the material is a solid it may be a chiral liquid crystalline glass, but it is further preferred that the material be a polymer formed by polymerizing a layer comprising chiral liquid crystalline fluid precursor monomer material into a polymer with the chiral liquid crystalline structure locked into place by crosslinking of molecules. It is preferred that the polymerization of the precursor monomer be accomplished by exposure to radiation and further preferred that the radiation be ultraviolet light.

The LEC 200 further comprises a second electrode 210. The second electrode 210 may be formed either from a light transmissive material or a light reflective material. However, if first electrode 204 is formed from a light reflective material, second electrode 210 must be formed from a light transmissive material. If the second electrode 210 is light transmissive, it may be formed from indium-tin oxide, tin oxide, graphene or some other suitable light transmissive material. If the second electrode 210 is light reflective, it may be formed from aluminum, a magnesium/aluminum alloy or some other suitable light reflective material.

When an electrical potential is placed across LEC 200 by voltage biasing one of the electrodes, 202 and 210, versus the other one of the two electrodes will act as an anode and one as a cathode. Either of the first or second electrodes may act as an anode or cathode. (In the example shown in FIG. 2 electrode 202 is taken to be the anode and electrode 210 is taken to be the cathode.) The material of chiral liquid crystalline organic material layer 208 functions as an electrolyte. Molecular species in layer 208 will be oxidized to positive ions at the anode 202 and will be reduced to negative ions at the cathode 210. The material of region 218 adjacent to the cathode 210 acts as though it has been negatively doped. The material of region 214 adjacent to the anode acts as though it has been positively doped. As the electric potential difference across the layer 208 is increased the "doped" layers grow inwards from the electrodes towards the center of layer 208. The doped regions act in a manner similar to the electrodes in an OLED injecting holes (from the "doped" material region 218 near the cathode 210) and injecting electrons (from the "doped" material region 214 near the anode 202) into the "undoped" material in the region 216 in the center of the chiral liquid crystalline organic material layer 208.

The material in the chiral liquid crystalline organic material layer 208 not only acts as an electrolyte, it also acts as an electroluminescent material. When the electrons and holes are injected from regions 218 and 214 respectively into region 216, they recombine to form excitons on electroluminescent molecules of chiral liquid crystalline organic material in layer 208 at the center of region 216. These excitons collapse to emit light.

As was described above, chiral liquid crystalline organic material layer 208 comprises rod-shaped molecules that spontaneously align themselves in a helical structure because of their liquid crystalline order. The liquid crystalline material in layer 208 is optically anisotropic with the refractive index ($n_e$) for light with its associated electric vector in the direction of the long axes of the rod-shaped molecules being higher in value than the refractive index ($n_o$) for light with its associated electric vector in one of the directions perpendicular to the long axis direction of the rod-shaped molecules. The light emitted at the center of zone 216 encounters the helical structure of layer 208 and in doing so is resolved into two circularly polarized components (right and left-handed). If, for example, the helical structure of layer 208 is a right-handed helix, the associated electric vector of right-handed circularly polarized light emitted perpendicularly to the plane of layer 208 and whose wavelength is given by $$\lambda = nP,$$

where: $\lambda$, is the wavelength of the emitted light,
$n=(n_o+n_2)/2$,
P is the pitch of the helical structure in layer 208;
will encounter a medium who refractive index is of constant value. This is because the electric vector of the right circularly polarized light will rotate synchronously with helical structure it encounters. On the other hand, left circularly polarized light of the same wavelength emitted perpendicularly to the plane of layer 208 will encounter a medium in which the refractive index oscillates cyclically between $n_e$ and $n_o$. This medium acts as a photonic crystal for the left circularly polarized light. It is the property of such a photonic crystal that a light emitting material in the photonic crystal is not allowed to emit light (there is no solution to the wave equation for light propagation) in a wavelength band (the "stop band") of spectral width $\Delta\lambda=\lambda\Delta n/n$, where $\Delta n=n_o-n_e$. However, light may be emitted at even higher intensities than in vacuum at the edges of the band. It is further the case that light emitted at the band edges is entrained or trapped in the photonic crystal leading to a buildup of photon density at the center of the photonic crystal.

From the above explanation of the effect the photonic crystal structure in device 200 it may be seen that if light emitting molecules in the center of region 216 emit light through electroluminescence at the band edge of the stop band formed by the chiral liquid crystal structure, a high density of photons will build up at the center of region 216. The photons interact with excitons formed in region 216 to stimulate emission of more left circularly polarized light (right circularly polarized if the helical structure in chiral liquid crystalline organic material layer 208 spontaneously forms a left-handed helix). The stimulated emission of left circularly polarized builds up until all light emission is left circularly polarized and stimulated. All light emission will also be in a tight cone of angles about the normal to the plane of surface 206. This nearly eliminates light loses due to internal reflection at layer interfaces (for instance between electrodes 202 and 210 and layer 208) within device 200.

Figure 1:
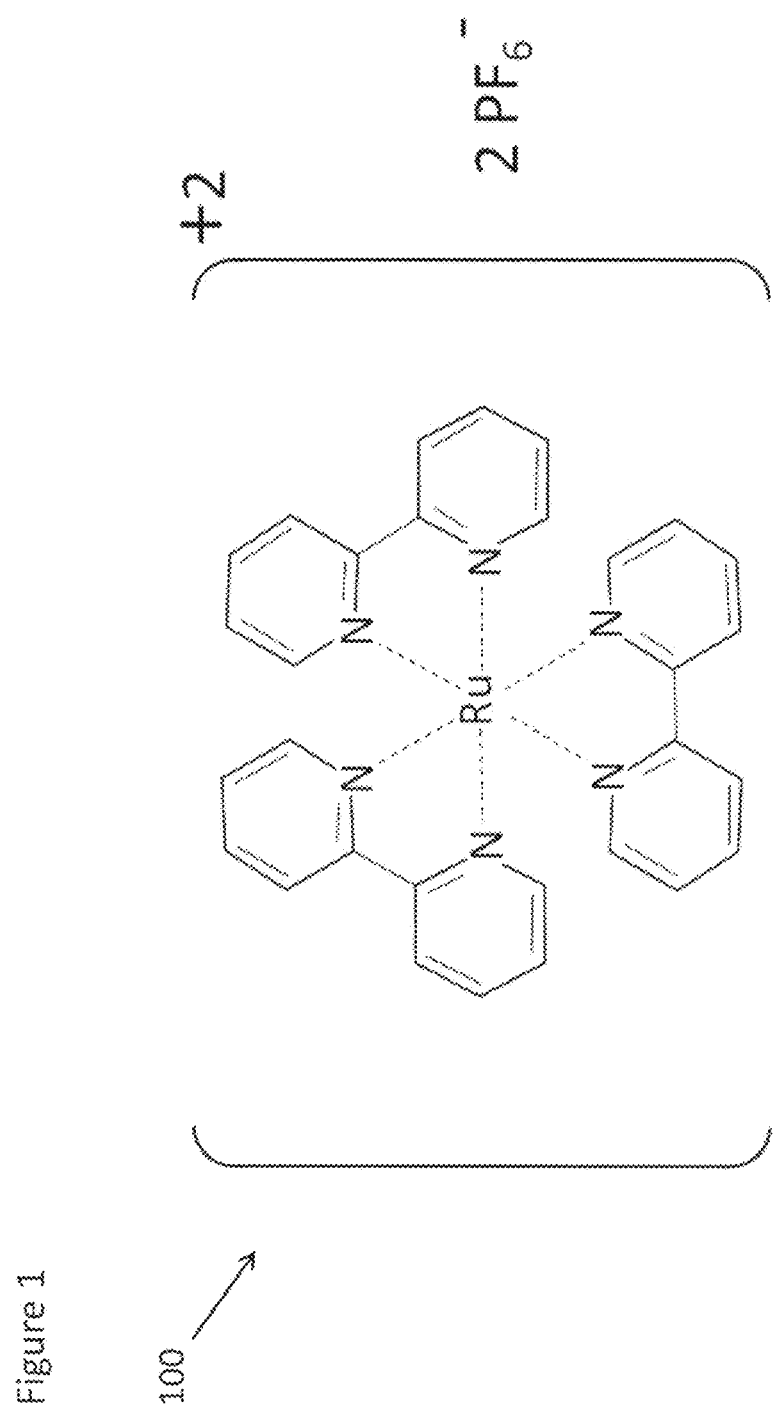
FIG. 1 illustrates a prior art ionic transition metal complex that acts as both a light emitting material and an electrolyte.

One issue with the use of organometallic electrolytes similar to 100 in FIG. 1 is that they are triplet emitters. In nearly all electroluminescent materials light emission is produced when an electron occupying an excited state molecular orbital returns to a base state molecular orbital already occupied by an unpaired electron that remains in the unexcited state. If the excited state electron has the opposite spin state to that of the electron in the base state molecular orbital, the excited state is referred to as a singlet state and the light emission is called singlet emission. If the excited state electron is in the same spin state as the unpaired based state electron, the excited state is referred to as a triplet state and any light emission is referred to as triplet emission. The return of triplet state electrons to the base energy state is quantum mechanically forbidden. As a result, in most electroluminescent materials only singlet emission occurs. The electrons in the triplet excited states in these materials slowly return to the base state by mechanisms that don't involve light emission. It is very advantageous that the light emitting molecules emit light both by singlet and triplet emission since there will three times as many triplet state excitons as singlet excitons. Light emitting materials containing heavy metal atoms such as the tris(2,2' bipyridyl) ruthenium(II) hexafluorophosphate in FIG. 1 can act as combined triplet and singlet emitters because the presence of the heavy metal atom causes spin-orbit interaction perturbing the triplet excited state molecular orbital and inducing light emission from the triplet excitons in a shorter period of time. There are several competing mechanisms that involve the exciton giving up its energy with the excited state electron returning to the base energy state. If light emission from an exciton does not occur in a sufficiently short period of time, one of the non-light emitting (non-radiative) processes will predominate. While the presence of the heavy metal atom shortens the time required for triplet emission, there is still sufficient time for the triplet excitons to undergo non-radiative interactions with the ionic charge carriers formed in the LEC and with polarons. These non-radiative interactions have severely limited the energy efficiency of light emission in IMTC-type LECs.

Given the very high photon densities in the helical chiral structures of these OLEDs light emission stimulated by photon-exciton interactions occurs even more rapidly than spontaneous singlet exciton light emission. Thus, the stimulated emission rapidly "short circuits" the heavy metal-induced spontaneous emission of triplet excitons harvesting the triplet excitons and greatly limiting light losses by non-radiative mechanisms. LECs utilizing the chiral band edge effect are much more energy efficient than conventional LECs.

Figure 3:
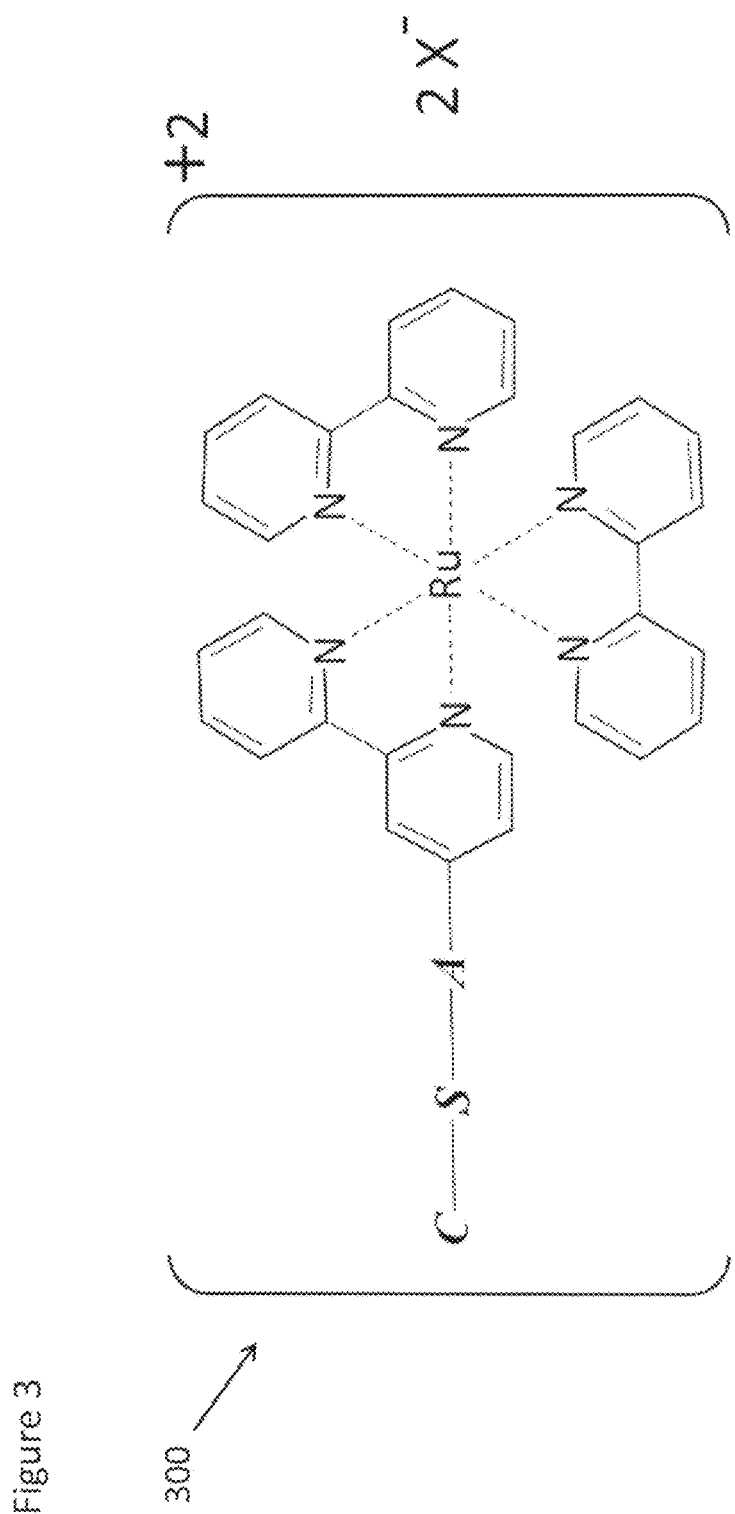
FIG. 3 illustrates a generic chemical structure of ruthenium II containing ionic transition metal complexes that function as electrolytes and light emitting materials.

Examples of a chiral liquid crystalline organic material for use in layer 208 utilize ruthenium II containing electrolyte and light emitting materials having the generic structure 300 in FIG. 3. Here A is rigid, rod or lath-shaped aromatic moiety, S is a flexible spacer, C is a crosslinking group (preferably a photocrosslinking group), and $X^-$ are negatively charged counter ions. Ionic materials of this type may act as both electrolytes and as triplet light emitters in LEC devices. The inclusion of the rod-shaped molecular structures A and flexible spacers S in the overall structure of materials 300 is meant allow incorporation of a large percentage of materials 300 in the formulation of chiral liquid crystalline materials for use in layers 208 without undesirably decreasing the stability of the chiral liquid crystalline phase of the material formulation.

Figure 4:
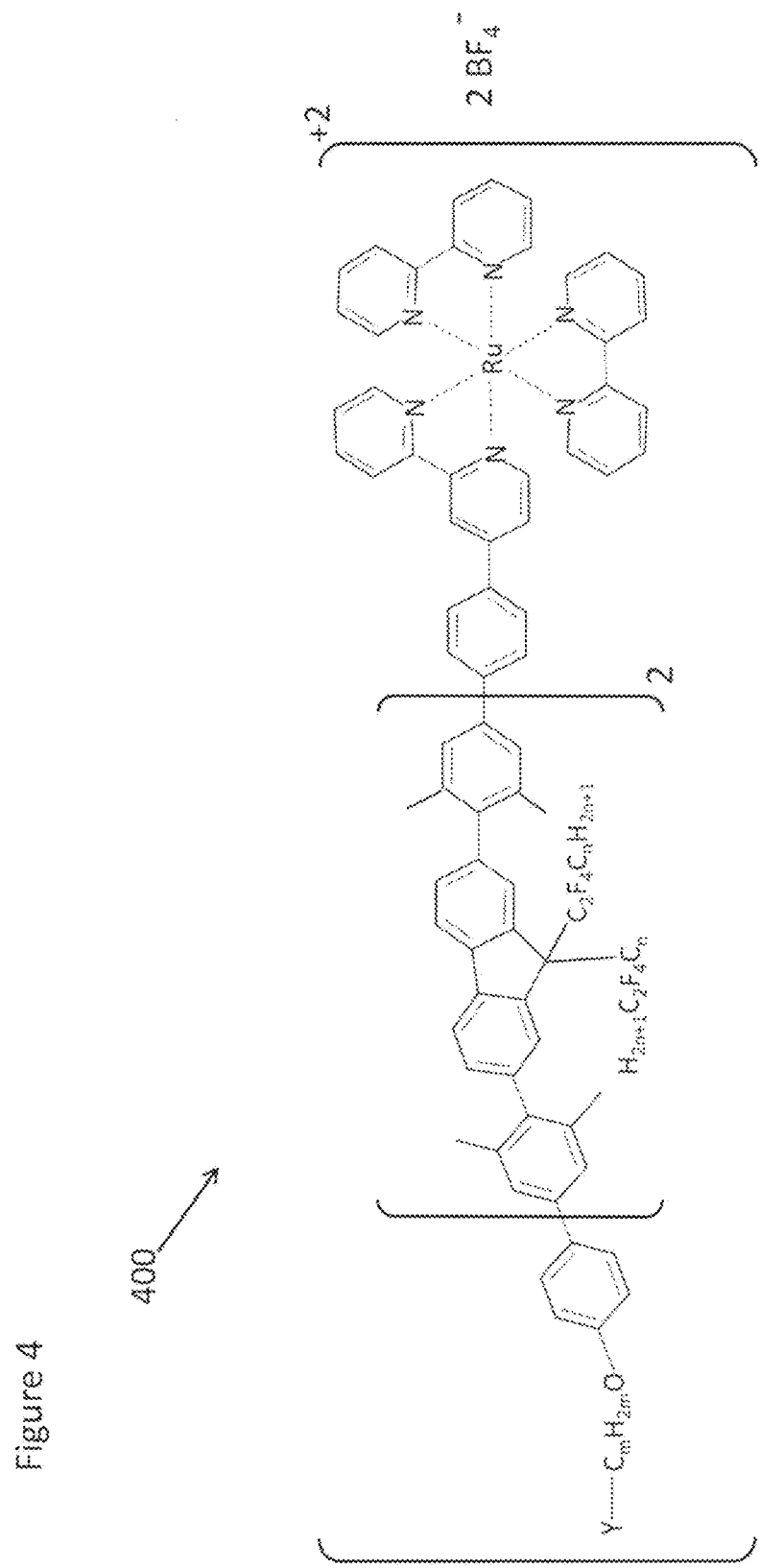
FIG. 4 illustrates the more specific structures of some of the ruthenium II complexes of FIG. 3.

More specific examples of ruthenium II containing ionic materials are depicted by the structure 400 in FIG. 4. Here n is some integer between 1 and 12 with the values of n possibly varying for each position in the structure, m is an integer between 3 and 14, and Y is a photocrosslinking group that may be chosen from a methacrylic group, a vinyl ether group, a maleimide group, a fumarate group, a maleate group or some other suitable photocrosslinking group.

Materials having structures like those depicted in FIGS. 3 and 4 are unlikely to have chiral liquid crystalline phases stable over useable temperature ranges when used as pure materials to constitute the material in chiral liquid crystalline organic material layers 208. Further, the materials depicted in FIGS. 3 and 4 are unlikely to be as useful as desired as chiral additives to induce helical structures with the proper pitch in layers 208. For this reason material compositions for layer 208 may be compounded with additional liquid crystalline materials, for example, those having molecules with the general structure:

B-S-A-S-B as described in U.S. Pat. No. 6,867,243, where A is a chromophore, S are flexible spacers, and B are end groups susceptible to photopolymerization. Particularly useful materials in this application are those with molecular structures B-S-A-S-B described in US Patent Application 2017/033290 in which chromophore A is rod or lath-shaped and contains the structural unit

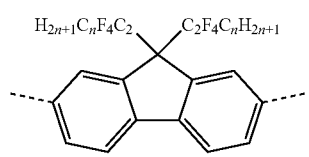

where n=2 to 10 and the dashed bond lines connect the structural unit to the remaining structures in the molecules. Other particularly useful materials in this application are those with molecular structures B-S-A-S-B described in patent application WO2018/065786 in which chromophore A is rod or lath-shaped and contains the structural unit

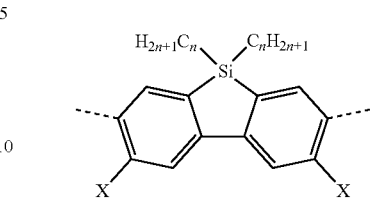

where n=2 to 10, "X moieties are selected from the group consisting of hydrogen, straight chain or branched $C_1$-$C_8$ alkyl, straight chain or branched $C_1$-$C_8$ alkoxy and a halogen", and the dashed bond lines connect the structural unit to the remaining structures in the molecules. Care must be taken that the materials used in layer 208 do not contain molecules whose molecular orbital structure contains unoccupied molecular orbitals whose energy levels are such that energy from excitons intended to result in light emission is transferred into the empty molecular orbitals thus quenching light emission.

The materials used in chiral liquid crystalline organic material layers 208 may also contain chiral dopants. Particularly useful chiral dopants are those that have structures

B-S-A-S-B as described above and described in U.S. Pat. No. 6,867,243 or US Patent Application 2017/033290 or patent application WO2018/065786 or combinations of structures from more one of these patent documents in which one or both of flexible spacers contain optically active centers.

If not otherwise stated herein, any and all patents, patent publications, articles and other printed publications discussed or mentioned herein are hereby incorporated by reference as if set forth in their entirety herein.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A light emitting electrochemical cell comprising two electrodes and a layer comprising a material wherein:

the layer is situated between the two electrodes, the material of the layer exhibits a chiral liquid crystalline phase, and wherein the material comprises a molecule having the structure:

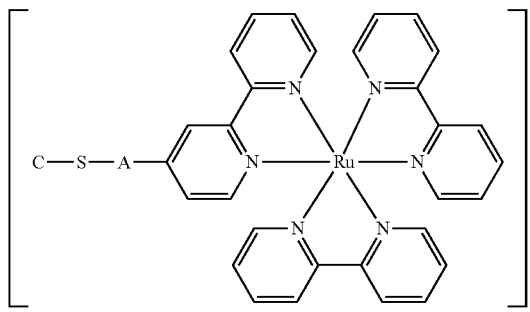

wherein A is a rigid rod or rigid lath-shaped aromatic moiety, S is a flexible spacer, C is a crosslinking group, and $X^-$ are negatively charged counter ions.

2. The light emitting electrochemical cell of claim 1 wherein the material comprises one or more of an organic material or an organometallic material.

3. The light emitting electrochemical cell of claim 2 in which the material comprises organometallic materials that are ionic in nature.

4. The light emitting electrochemical cell of claim 1 wherein the chiral liquid crystalline phase is a chiral nematic liquid crystalline phase.

5. The light emitting electrochemical cell of claim 1 wherein the material comprises polymeric materials.

6. The light emitting electrochemical cell of claim 5 wherein the polymeric material has been photopolymerized.

7. The light emitting electrochemical cell of claim 1 wherein the material comprises a glass phase.

8. The light emitting electrochemical cell of claim 1 wherein at least one of the two electrodes is transparent.

9. The light emitting electrochemical cell of claim 8 wherein one of the electrodes is light reflective.

10. The light emitting electrochemical cell of claim 1 wherein the material comprises one or more electroluminescent materials.

11. The light emitting electrochemical cell of claim 1 wherein the material acts as a one-dimensional photonic crystal.

12. The light emitting electrochemical cell of claim 11 wherein the material exhibits a photonic stop band in the emission spectrum of any light emitting materials located in the layer.

13. The light emitting electrochemical cell of claim 12 wherein a luminescent material in the layer emits light in wavelengths at the edge of the photonic stop band.

14. The light emitting electrochemical cell of claim 13 wherein the material emits light by stimulated emission.

15. The emitting electrochemical cell of claim 1 wherein the crosslinking group is a photocrosslinking group.

16. The light emitting electrochemical cell of claim 1 wherein the material comprises a molecule having the structure:

B-S-A-S-B wherein A is a chromophore, S are flexible spacers, and B are end groups susceptible to photopolymerization.

17. The light emitting electrochemical cell of claim 16 wherein the material comprises a liquid crystalline structure.

18. The light emitting electrochemical cell of claim 16 wherein one or both of flexible spacers S contain optically active centers.

* * * * *